United States Patent [19]

Asch et al.

[11] Patent Number: 4,980,536
[45] Date of Patent: Dec. 25, 1990

[54] REMOVAL OF PARTICLES FROM SOLID-STATE SURFACES BY LASER BOMBARDMENT

[75] Inventors: Karl Asch, Guelstein; Joachim Keyser, Wildberg; Klaus Meissner, Ammerbuch; Werner Zapka, Rohrau, all of Fed. Rep. of Germany

[73] Assignee: International Business Machines Corporation, Armonk, N.Y.

[21] Appl. No.: 474,561

[22] Filed: Jan. 8, 1990

Related U.S. Application Data

[63] Continuation of Ser. No. 210,540, Jun. 23, 1988, abandoned.

[30] Foreign Application Priority Data

Jul. 2, 1987 [DE] Fed. Rep. of Germany ....... 3721940

[51] Int. Cl.$^5$ .............................................. B23K 26/00
[52] U.S. Cl. .......................... 219/121.68; 219/121.82; 219/121.86
[58] Field of Search ...................... 219/121.68, 121.69, 219/121.6, 121.85, 121.82, 121.86

[56] References Cited

U.S. PATENT DOCUMENTS 4,720,621 1/1988 Langen ...................... 219/121.69 X Primary Examiner—C. L. Albritton
Attorney, Agent, or Firm—Stephen J. Limanek

[57] ABSTRACT

To remove small particles from surfaces of solid bodies at least one laser pulse of high power density (excimer laser) is directed onto the surface. The method is particularly suited to clean Si-masks used in electron-beam lithographic devices. An arrangement for in-situ-cleaning of masks in accordance to this method is integrated in such an electron-beam lithographic device.

5 Claims, 2 Drawing Sheets

4,980,536

REMOVAL OF PARTICLES FROM SOLID-STATE SURFACES BY LASER BOMBARDMENT

This application is a continuation application of parent application having Ser. No. 210,540 filed 06/23/88 now abandoned.

TECHNICAL FIELD

This invention relates to a method of removing small particles from solid-state surfaces, as well as to an apparatus for implementing the method on masks in a lithographic system.

BACKGROUND ART

A preferred application of the invention includes cleaning silicon (Si) membrane masks which are used, for example, in electron beam lithography to produce integrated circuits. In the lithographic process, particles whose diameter exceeds about ¼ of the mask's line width have to be kept away from the mask. For a line width of 0.35 $\mu$m this means that particles down to a size of about 100 nm adversely affect the lithographic process and, therefore, have to be removed. Previously known methods are unsuitable for this purpose, as the adhesion forces occurring with such small particles are high relative to their size. Larger particles (>1000 nm) are removed by rinsing with a liquid or a gas jet, or are kept away by such means.

In photolithographic processes, thin transparent foils, so-called pellicles, may be positioned at a short distance above the mask to keep particles away from the mask. However, in lithographic processes using electron or ion beams no material objects must be introduced into the beam path. In addition, owing to the desired, and possibly, smaller line widths, such processes are adversely affected by particles that are even smaller than those occurring in photolithographic processes. Similar problems are encountered, for example, in medicine or chemistry, say, for catalysis, and generally in conjunction with any applications where extremely clean surfaces have to be produced, processed or treated.

DISCLOSURE OF THE INVENTION

It is an object of this invention to solve the problem of removing small particles from solid-state surfaces.

In accordance with the teachings of this invention, a surface to be cleaned is bombarded with at least one high-power laser pulse, whose length and power density are such that the surface itself is not damaged. Essential advantages of the invention are that it provides an effective, simple and non-destructive cleaning method for solid-state surfaces. In addition, in particular for mask cleaning, the method can be readily integrated in lithographic systems for in-situ cleaning.

The foregoing and other objects, features and advantages of the invention will be apparent from the following more particular description of the preferred embodiments of the invention, as illustrated in the accompanying drawings.

The following embodiment of the invention is described mainly with reference to the cleaning of Si membrane masks. However, by adapting the parameters, the indicated results may also be obtained for other substance classes, in particular for semiconductors and insulators, and other applications involving smooth or structured surfaces.

Figure 1:
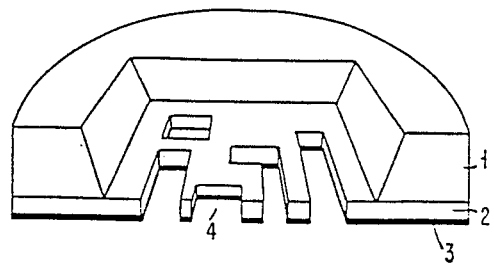
FIG. 1 is a schematic sketch of a silicon (Si) mask used in electron beam lithography.

FIG. 1 shows a cross-section of an isometric view of an Si mask of the type used in electron beam lithography and as described, for example, in (1) H. Bohlen et al, IBM Journal Research and Development, Vol. 26, No. 5 (1982) 568–579. The surface of an Si wafer 1 is provided with a 2 to 3 $\mu$m thick boron (B)-doped layer 2 acting as an etch stop and a gold (Au) layer 3 for absorbing the electron beam and transporting the heat. In several process steps (using reactive ion etching and backetching), layer 2 is provided with the desired pattern in the form of physical holes or openings 4. The Si membrane thus obtained acts as a mask for generating the desired structures on a further Si wafer by shadowcasting. With higher integration densities, the required line widths, i.e., the width of the holes or openings 4, decreases, so that contaminations and particles however slight are detrimental.

Figure 2:
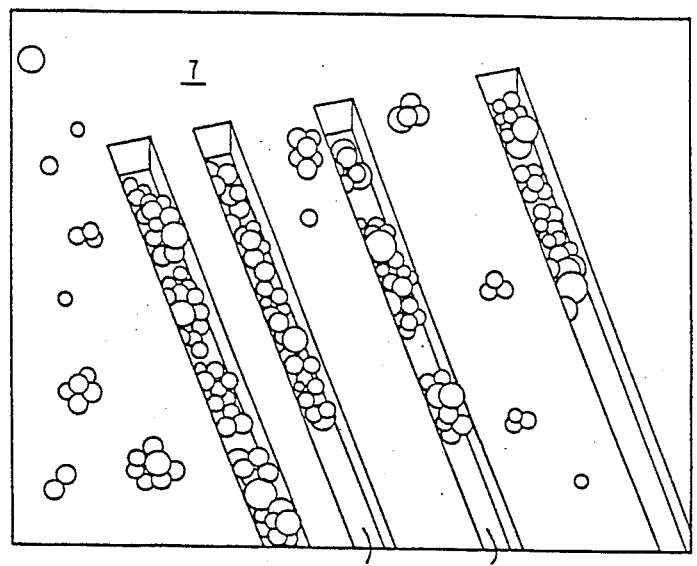
FIG. 2 shows a mask contaminated with particles according to FIG. 1 prior to bombardment with a pulsed laser beam.

FIG. 2 is a drawing based on a Secondary Electron Microscope (SEM) image of a contaminated electron beam lithographic mask with particles on the surface 7 and in the holes or openings 8. The particles may occur in an isolated form or as agglomerates.

During the implementation of the method according to the invention it has been found surprisingly that only a few illuminations, or even only a single illumination, of such structured surfaces by a high-power laser pulse are sufficient to remove in particular submicron particles from the surface itself and from the holes, without damaging or otherwise impairing the surface.

When a laser is used for this purpose, the power density must be sufficient to achieve a cleaning effect. In addition, the power density and the radiation period (pulse length) must be such that they do not melt or remove the surface to be cleaned. Excimer lasers, for example, meet such requirements, as, on the one hand, they have the desired power densities and, on the other, they may be operated with very short pulse lengths. Particularly with Si masks, such lasers have the additional advantage that the short wavelength (UV range) of their radiation is largely reflected, thus, avoiding any noticeable heating, provided the power densities are suitably selected.

The parameter range of wavelength, incident power density and radiation period is relatively wide for the method according to the invention, wherein particles are selectively removed only from the surface without damaging the latter. This parameter range is determined by a number of factors for each application. It depends on the wavelength of the laser and the type of contamination, for example, its absorption coefficient at the laser wavelength used. It also depends on the size of the particles, since it is to be expected that large particles are more difficult to remove than small ones. It finally depends on the material to be cleaned, its absorption coefficient, whether it melts easily, as well as on the nature of the surface to be cleaned, i.e., on whether the surface is amorphous or monocrystalline, for example.

Large surface areas may be irradiated (if lasers of a high power density are used) or irradiation may be effected in raster fashion, using suitably shaped or focused laser beams.

For implementing the cleaning method according to the invention, Si masks were covered with polymer particles (latex) as well as with aluminum oxide ($Al_2O_3$) particles with a diameter of about 500 nm (in an ethanol suspension). After evaporation of the ethanol, the particles are present on the surface and in the holes representing the mask structure as single closely adjacent particles and as agglomerates. For the tests, excimer lasers (KrF, XeCl) were used with pulse lengths ranging from 5 to 10 ns. The power density focused onto the mask was 21 $MW/cm^2$ for KrF and
15 $MW/cm^2$ for XeCl.

Most of the particles, even those in the mask holes, were removed by one laser pulse. There was no difference between the cleaning test results for the organic polymer particles and the inorganic aluminum oxide particles.

For exploring how the method works during particle removal, tests were carried out with continuous photoresist films and polyimide foils at an incident power density of about 50 $MW/cm^2$, when ablation depths of about 200 nm/pulse were observed. The removed material probably evaporates. Based on these results, one should expect that, at similar pulse lengths and power densities, a single laser pulse used for surface cleaning removes only particles up to a diameter of about 200 nm. This, however, is surprisingly not the case. Particles are obviously removed more easily than continuous films. How the method actually works is still to be clarified. It may be assumed, however, that not only evaporation processes are involved. This is also suggested by the fact that the aluminum oxide particles which are harder and less absorptive than the polymer particles are removed just as well. The recoil impulse resulting from surface oscillations or evaporation of the particle material may contribute to overcoming the adhesion force, thus causing the particles to be removed in full.

It is essential that the mask to be cleaned remains undamaged at the power densities and the pulse lengths applied, particularly where lasers are used to clean very thin Si membrane masks. A change or deformation of edges and structures attributable to a melting of the Si surface has not been observed. While maintaining the pulse lengths of about 5 to 10 ns, a destruction of the mask was observed only at much higher power densities of about 1 $GW/cm^2$. This affords a wide parameter range which permits optimum adjustment when the method according to the invention is applied to other contaminations.

Figure 3:
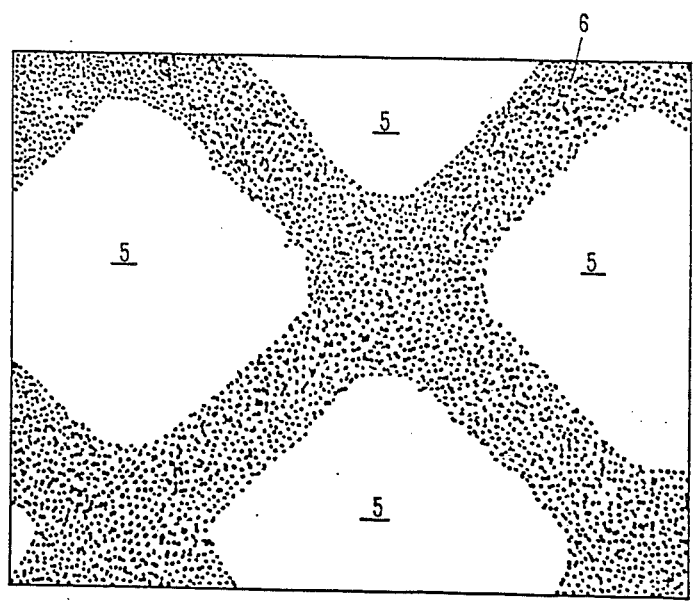
FIG. 3 shows a surface contaminated with particles after bombardment, of which only the regions illuminated through a cross diaphragm have been cleaned.

FIG. 3 is a drawing based on a Secondary Electron Microscope (SEM) image of a surface contaminated with particles (of a diameter of 500 nm) and which was subjected to a laser beam through a cross diaphragm (line width 45 μm). The result shows quite clearly that only the regions 5 of the surface on which the beam was incident are cleaned, while the regions 6 covered by the diaphragm are not cleaned. The transitions between the two regions are sharp, which proves that the particles are removed in response to the incident radiation rather than as a result of mask oscillations.

As with particular types of particles, direct laser bombardment may lead to damage of the surface to be cleaned, a further embodiment of the invention uses an auxiliary layer which is applied to the surface to be cleaned as well as to the particles to be removed. This auxiliary layer may preferably be made of a highly absorptive material, such as a metal selected in dependence of the wavelength to be used. The auxiliary layer is removed by laser bombardment and along with that layer the particles are also removed. Tests with Au layers on Si masks have shown that this special method does not damage the masks either and that the formation of an alloy is prevented by the short pulse lengths.

Figure 4:
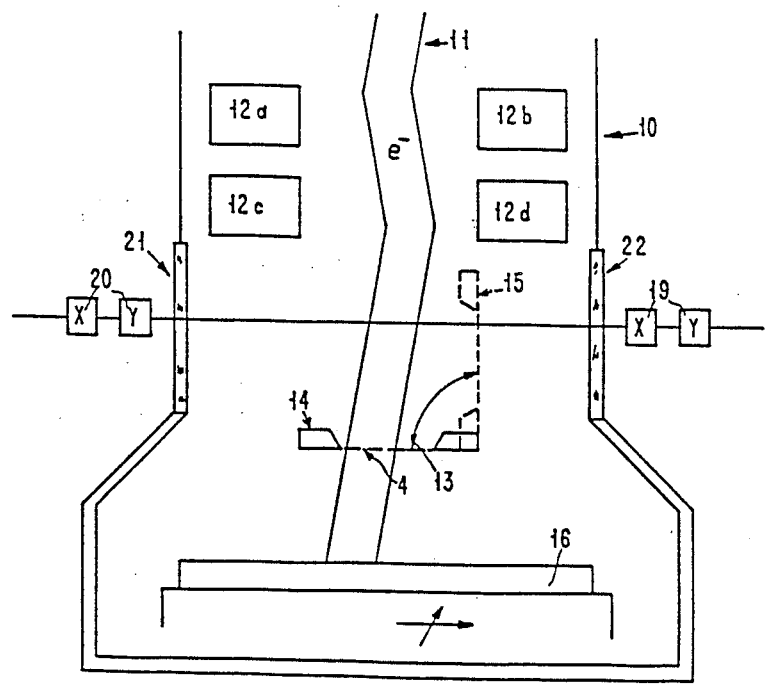
FIG. 4 is a schematic representation of an electron beam lithographic system with an arrangement for in-situ cleaning the mask according to the invention.

FIG. 4 is a schematic sketch of an electron beam lithographic system 10 with an integrated arrangement by means of which the cleaning method according to the invention may be used for in-situ mask cleaning. An electron beam 11 is scanned by deflectors 12a–12d across the mask 13 which is in a folded down or lowered position 14 during illumination. Wafer 16 to be illuminated through the mask holes 4 by the step-and-repeat process is positioned on a movable table. Through the two windows 21, 22, two laser beams which are pulsed and, if necessary, also focused are rastered by x-, y- deflectors 19,20 across the top and bottom side of the mask. During cleaning, the mask is in a folded up or raised position 15. As the mask can be folded up or raised, its bottom side can also be cleaned, which, in addition, substantially prevents a redeposition of removed particles.

While the invention has been particularly shown and described with reference to preferred embodiments thereof, it will be understood by those skilled in the art that various changes in form and details may be made therein without departing from the spirit and scope of the invention.

What is claimed is:

1. Apparatus for removing small particles from a surface of a lithographic mask comprising
   a lithographic system, said lithographic mask being disposed within said system,
   means for bombarding the surface on which the particles are disposed with at least one laser pulse having a power density such that the surface itself is undamaged by the laser pulse, and
   means for positioning said mask within said lithographic system so that the surface on the front and back side of said mask is exposed to said laser pulse.

2. Apparatus for removing small particles from a surface of a lithographic mask comprising
   means for bombarding the surface on which the particles are disposed with at least one laser pulse having a power density such that the surface is undamaged by the laser pulse,
   means for positioning said mask so that the surface on the front and back side of said mask is exposed to said laser pulse, and
   a lithographic system having windows and means for introducing said laser pulse through said windows.

3. Apparatus for removing small particles from a surface of a lithographic mask comprising
   means for bombarding the surface on which the particles are disposed at least one laser pulse having a power density such that the surface is undamaged by the laser pulse, and means for positioning said mask so that the surface on the front and back side of said mask is exposed to said laser pulse, said mask positioning means positioning said mask in a vertical direction.

4. Apparatus for removing small particles from a surface of a lithographic mask as set forth in claim 1 wherein said positioning means includes means for pivotally moving said mask.

5. Apparatus for removing small particles from a surface of a lithographic mask as set forth in claim 4 wherein said bombarding means includes two laser beams, one of said two laser beams impinging on said front side and the other of said two laser beams impinging on said back side.

* * * * *